United States Patent
Ho et al.

(10) Patent No.: US 10,923,633 B2
(45) Date of Patent: Feb. 16, 2021

(54) TOP-EMITTING LIGHT-EMITTING DIODE

(71) Applicant: OPTO TECH CORPORATION, Hsinchu (TW)

(72) Inventors: Yi-Lin Ho, Taipei (TW); Jun-Jie Lin, Changhua County (TW); Lung-Han Peng, Taipei (TW)

(73) Assignee: OPTO TECH CORPORATION, Hsinchu (TW)

( * ) Notice: Subject to any disclaimer, the term of this patent is extended or adjusted under 35 U.S.C. 154(b) by 0 days.

(21) Appl. No.: 16/508,374

(22) Filed: Jul. 11, 2019

(65) Prior Publication Data
US 2020/0313044 A1    Oct. 1, 2020

(30) Foreign Application Priority Data
Mar. 25, 2019  (TW) ................................ 108110340

(51) Int. Cl.
| H01L 33/16 | (2010.01) |
| H01L 33/46 | (2010.01) |
| H01L 33/42 | (2010.01) |
| H01L 33/38 | (2010.01) |
| H01L 33/26 | (2010.01) |
| H01L 33/06 | (2010.01) |

(52) U.S. Cl.
CPC ............ *H01L 33/465* (2013.01); *H01L 33/26* (2013.01); *H01L 33/38* (2013.01); *H01L 33/42* (2013.01); *H01L 33/06* (2013.01); *H01L 2933/0016* (2013.01); *H01L 2933/0083* (2013.01)

(58) Field of Classification Search
None
See application file for complete search history.

(56) References Cited

U.S. PATENT DOCUMENTS

| 2008/0001538 A1* | 1/2008 | Cok | ........................ B82Y 20/00 |
| | | | 313/506 |
| 2013/0033870 A1* | 2/2013 | Suehiro | .................. H01L 33/46 |
| | | | 362/267 |
| 2018/0083070 A1 | 3/2018 | Zhang et al. | |
| 2019/0081120 A1 | 3/2019 | Zhang et al. | |

FOREIGN PATENT DOCUMENTS

CN          102217114         10/2011

OTHER PUBLICATIONS

Elisabeth Bodenstein et al., "Realization of RGB colors from top-emitting white OLED by electron beam patterning", Apr. 23, 2018, Journal of the SID, 2018.

(Continued)

*Primary Examiner* — Cheung Lee
(74) *Attorney, Agent, or Firm* — WPAT, PC

(57) ABSTRACT

A top-emitting light-emitting diode includes a glass substrate, a polysilicon layer, a white light emitting layer and a transparent conductive layer. The polysilicon layer is formed on a first surface of the glass substrate. Moreover, plural sub-wavelength structures are discretely arranged on a surface of the polysilicon layer at regular intervals. The white light emitting layer is formed over the polysilicon layer and the plural sub-wavelength structures. The transparent conductive layer is formed over the white light emitting layer.

12 Claims, 5 Drawing Sheets

(56) References Cited

OTHER PUBLICATIONS

Jin Cao et al., "RGB tricolor produced by white-based top-emitting organic light-emitting diodes with microcavity structure", Nov. 9, 2006, pp. 300-304,Current Applied Physics 7 (2007).
Weiwei Zhang et al., "Full color organic light-emitting devices with microcavity structure and color filter", May 11, 2009, vol. 17, No. 10, pp. 8005-8011, Optics Express.
Baek-woon Lee et al., "Micro-cavity design of bottom-emitting AMOLED with white OLED and RGBW color filters for 100% color gamut", May 20-23, 2008, pp. 151-157, Journal of the SID 17/2, 2009.
Taiwan Patent Office "Office Action" dated Nov. 12, 2019, Taiwan.

* cited by examiner

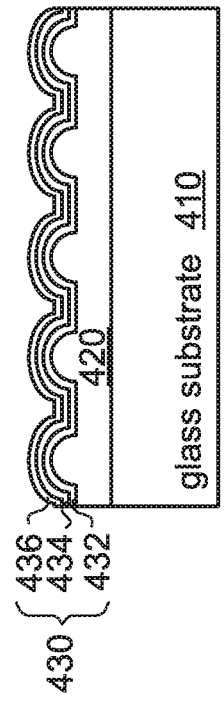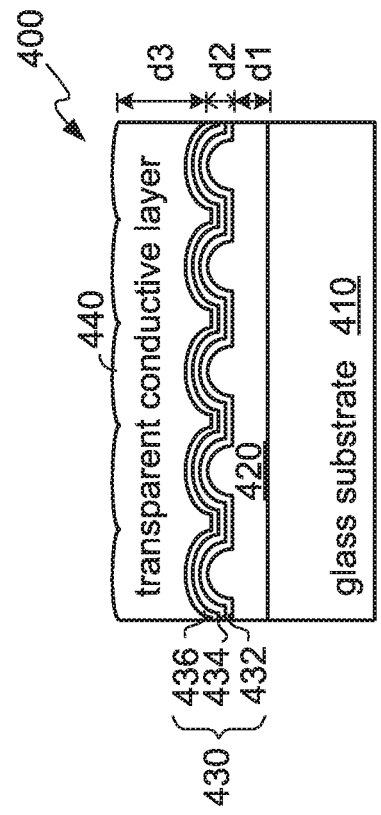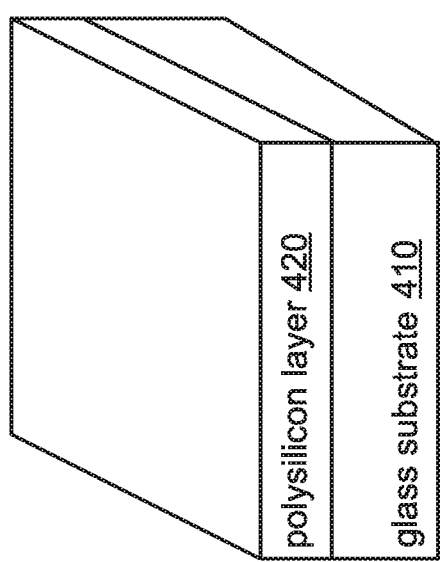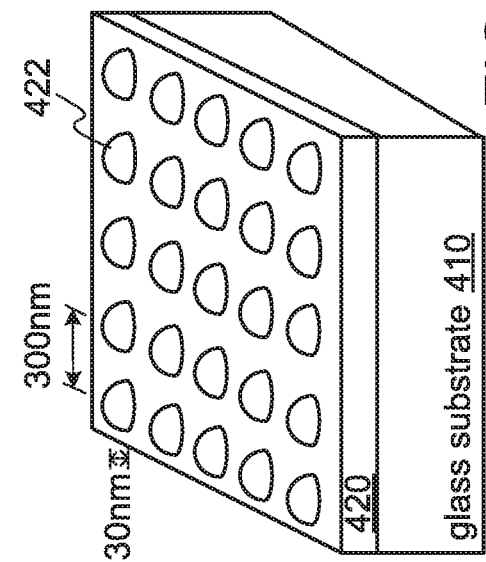

TOP-EMITTING LIGHT-EMITTING DIODE

This application claims the benefit of Taiwan Patent Application No. 108110340, filed Mar. 25, 2019, the subject matter of which is incorporated herein by reference.

FIELD OF THE INVENTION

The present invention relates to a light-emitting diode (LED), and more particularly to a top-emitting light-emitting diode.

BACKGROUND OF THE INVENTION

FIG. 1 schematically illustrates the structure of a conventional top-emitting organic light-emitting diode (OLED). This top-emitting OLED is published in Journal of the Society for Information Display (SID), page 555, on Sep. 26, 2018.

A process of fabricating the conventional top-emitting OLED 100 will be described as follows. Firstly, plural anodes are formed on a substrate 110. These anodes include an anode (G) 122, an anode (B) 124 and an anode (R) 126. A hole transport layer 130 is patterned to have different thicknesses to cover the anode (G) 122, the anode (B) 124 and the anode (R) 126. Then, a white emission layer 140, an electron transport layer 150, a cathode 160 and an encapsulation layer 170 are sequentially stacked over the hole transport layer 130. Meanwhile, the OLED 100 is fabricated.

The OLED 100 is a top-emitting white OLED that emits red, green and blue light beams for display applications. By using an e-beam evaporation process, the hole transport layer 130 is patterned to have different thicknesses. Consequently, a RGB microcavity for adjusting a resonator length is formed. In such way, red, green, and blue colors are realized by microcavity-based mode selection from the white spectrum.

FIG. 2 schematically illustrates the structure of another conventional top-emitting organic light-emitting diode. This top-emitting OLED is published in Current Applied Physics, 7, 300-304 (2007).

After a silver reflective layer 220, an indium tin oxide (ITO) layer 230, a white light emitting layer 240, a semitransparent aluminum layer 250 and a semitransparent silver layer 260 are sequentially formed on a glass substrate 210, the OLED 200 is fabricated.

In the OLED 200, the silver reflective layer 220 is used as a reflector, and the ITO layer 230 is used as an adjusting layer. The semitransparent aluminum layer 250 and a semitransparent silver layer 260 are collaboratively formed as a cathode. The white light emitting layer 240 is the combination structure of Alq:DCJTB/TBADN/TBPe/Alq:C545. By properly adjusting the thickness of the ITO layer 230, an optical length of the microcavity and the color of the OLED 200 are changed. Consequently, the tricolor OLED 200 can be fabricated.

FIG. 3 schematically illustrates the structure of another conventional top-emitting organic light-emitting diode. This top-emitting OLED is published in No. 10/OPTICS EXPRESS 8005, Vol. 17, p. 8005, on 11 May 2009.

A process of manufacturing the conventional top-emitting OLED will be described as follows. Firstly, plural color filters (CF) are formed on a glass substrate 310. These color filters include a red color filter (CF-R) 322, a green color filter (CF-G) 324 and a blue color filter (CF-B) 326. Then, these color filters are covered by a protection resin layer 328. Then, a distributed Bragg reflecting layer (DBR) 330 is formed on the protection resin layer 328.

Then, plural ITO layers with different thicknesses are formed on the DBR layer 330. For example, these ITO layers include a red ITO layer (ITO-R) 342, a green ITO layer (ITO-G) 344 and a blue ITO layer (ITO-B) 346. Then, these ITO layers are covered by a polymeric conductive layer 348. For example, the polymeric conductive layer 348 is made of 4-polyethylenedioxythiophenepolystyrenesulfonate (PEDOT). Then, a white light emitting layer 350 is formed on the polymeric conductive layer 348. After a metal layer 360 is formed on the white light emitting layer 350, the OLED 300 is fabricated.

The metal layer 360 of the OLED 300 is used as a cathode. The ITO layers are used as anodes. Moreover, the ITO layers are used for creating different microcavity spaces. Consequently, the OLED 300 emits the three colors (i.e., RGB).

Except for the top-emitting OLED, a bottom-emitting OLED is another type of OLED. For example, a bottom-emitting OLED is disclosed in Journal of SID, page 151, on Feb. 17, 2009.

SUMMARY OF THE INVENTION

An object of the present invention provides a top-emitting LED. The top-emitting LED has a microcavity for adjusting the wavelength of the light beam from the LED.

An embodiment of the present invention provides a top-emitting light-emitting diode. The top-emitting light-emitting diode includes a glass substrate, a polysilicon layer, a white light emitting layer and a transparent conductive layer. The polysilicon layer is formed on a first surface of the glass substrate. Moreover, plural sub-wavelength structures are discretely arranged on a surface of the polysilicon layer at regular intervals. The white light emitting layer is formed over the polysilicon layer and the plural sub-wavelength structures. The transparent conductive layer is formed over the white light emitting layer.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIGS. 4A to 4D schematically illustrate a process of fabricating a top-emitting light-emitting diode according to a first embodiment of the present invention;

DETAILED DESCRIPTION OF PREFERRED EMBODIMENTS

Figure 1:
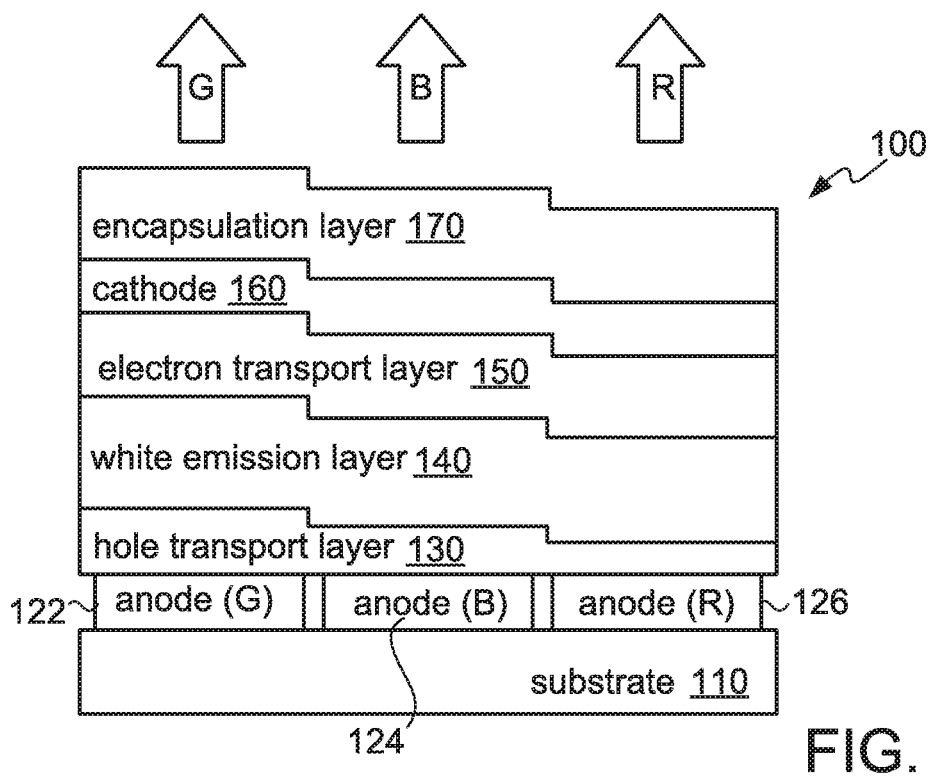
FIG. 1 (prior art) schematically illustrates the structure of a conventional top-emitting organic light-emitting diode.
Figure 2:
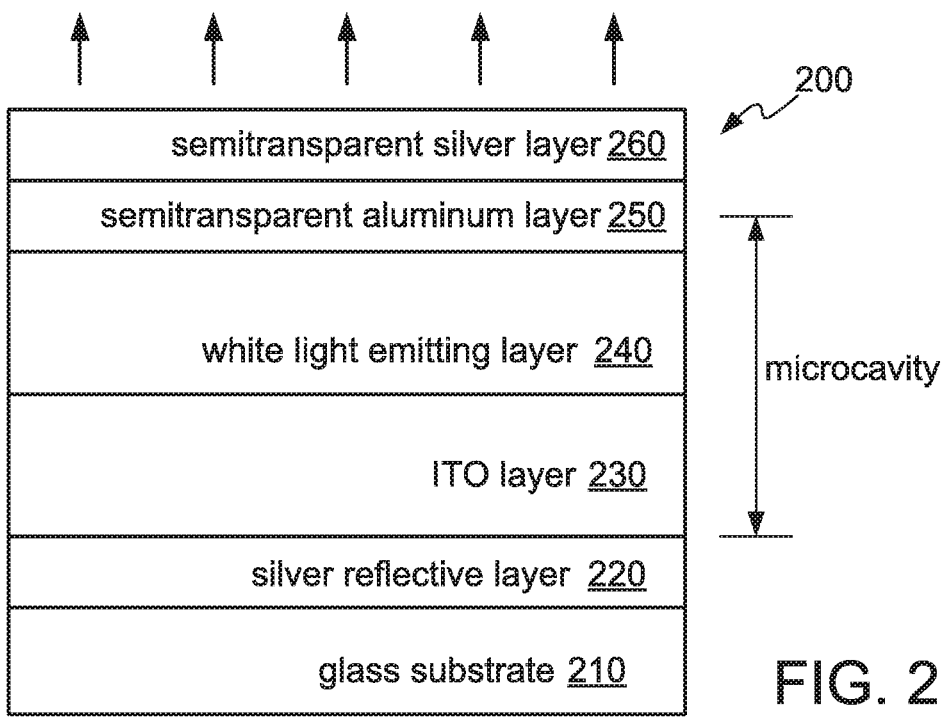
FIG. 2 (prior art) schematically illustrates the structure of another conventional top-emitting organic light-emitting diode.
Figure 3:
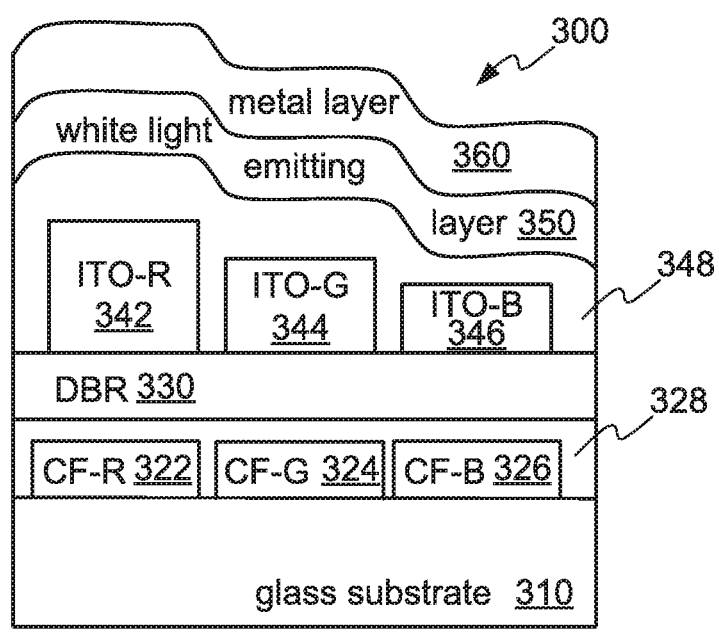
FIG. 3 (prior art) schematically illustrates the structure of another conventional top-emitting organic light-emitting diode.

FIGS. 4A to 4D schematically illustrate a process of fabricating a top-emitting light-emitting diode according to a first embodiment of the present invention.

Firstly, as shown in FIG. 4A, a polysilicon layer 420 is formed on a glass substrate 410.

Please refer to FIG. 4B. Then, a laser annealing process is performed to cyclically irradiate a laser beam on the polysilicon layer 420. Due to a self-assembly effect, plural sub-wavelength structures 422 are discretely arranged on the polysilicon layer 420 at regular intervals in both directions. For example, the regular interval is 300 nm, and the height of the sub-wavelength structure 422 is 30 nm. Moreover, the polysilicon layer 420 is an n-type polysilicon layer or a p-type polysilicon layer.

Please refer to FIG. 4C. Then, a white light emitting layer 430 is formed over the polysilicon layer 420. In an embodiment, the white light emitting layer 430 has a single-quantum-well double-barrier structure. In an embodiment, the white light emitting layer 430 is a stack structure comprising a first barrier layer 432, a quantum well layer 434 and a second barrier layer 436. For example, the stack structure is an aluminium gallium oxynitride/indium gallium oxynitride/aluminium gallium oxynitride (AlGaON/InGaON/AlGaON) stack structure, a hafnium oxynitride/aluminium gallium oxynitride/hafnium oxynitride (HfON/AlGaON/HfON) stack structure, an aluminium gallium oxynitride/zinc oxynitride/aluminium gallium oxynitride (AlGaON/ZnON/AlGaON) stack structure. In another embodiment, the the white light emitting layer 430 has a multiple-quantum-well double-barrier structure. For example, the white light emitting layer 430 is an aluminium gallium oxynitride/indium gallium oxynitride/aluminium gallium oxynitride/indium gallium oxynitride/aluminium gallium oxynitride (AlGaON/InGaON/AlGaON/InGaON/AlGaON) stack structure.

Please refer to FIG. 4D. After a transparent conductive layer 440 is formed on the white light emitting layer 430, the top-emitting light-emitting diode 400 is fabricated. For example, the transparent conductive layer 440 is an indium tin oxide (ITO) layer or an indium zinc oxide (IZO) layer.

In an embodiment, the polysilicon layer 420, the white light emitting layer 430 and the transparent conductive layer 440 are collaboratively formed as a microcavity of the top-emitting light-emitting diode 400. The polysilicon layer 420 has a thickness d1. The white light emitting layer 430 has a thickness d2. The transparent conductive layer 440 has a thickness d3. A total thickness t (i.e., t=d1+d2+d3) is not larger than $2\lambda/n$, wherein $\lambda$ is the wavelength and n is a refractive index of the microcavity corresponding to the wavelength. The wavelength $\lambda$ is in the range between 500 nm and 600 nm. Preferably, the total thickness t is equal to $\lambda/n$ or $2\lambda/n$.

The characteristics of some exemplary light-emitting diode of the present invention will be described in more details as follows. The light intensity is indicated by an arbitrary unit (a.u.).

Figure 5A:
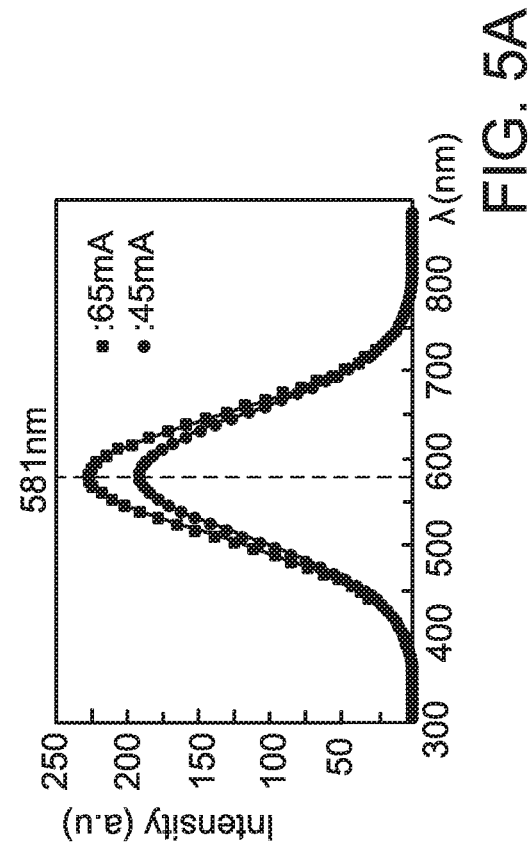
FIG. 5A schematically illustrates a spectrum of a first exemplary white light-emitting diode.

FIG. 5A schematically illustrates a spectrum of a first exemplary white light-emitting diode. In this example, the white light emitting layer is the AlGaON/InGaON/AlGaON stack structure, and the substrate is a p-type substrate. In case that the driving current is 45 mA, the light intensity of the white LED is about 175 (a.u), and the peak wavelength is about 581 nm. In case that the driving current is 65 mA, the light intensity of the white LED is about 225 (a.u), and the peak wavelength is about 581 nm.

Figure 5B:
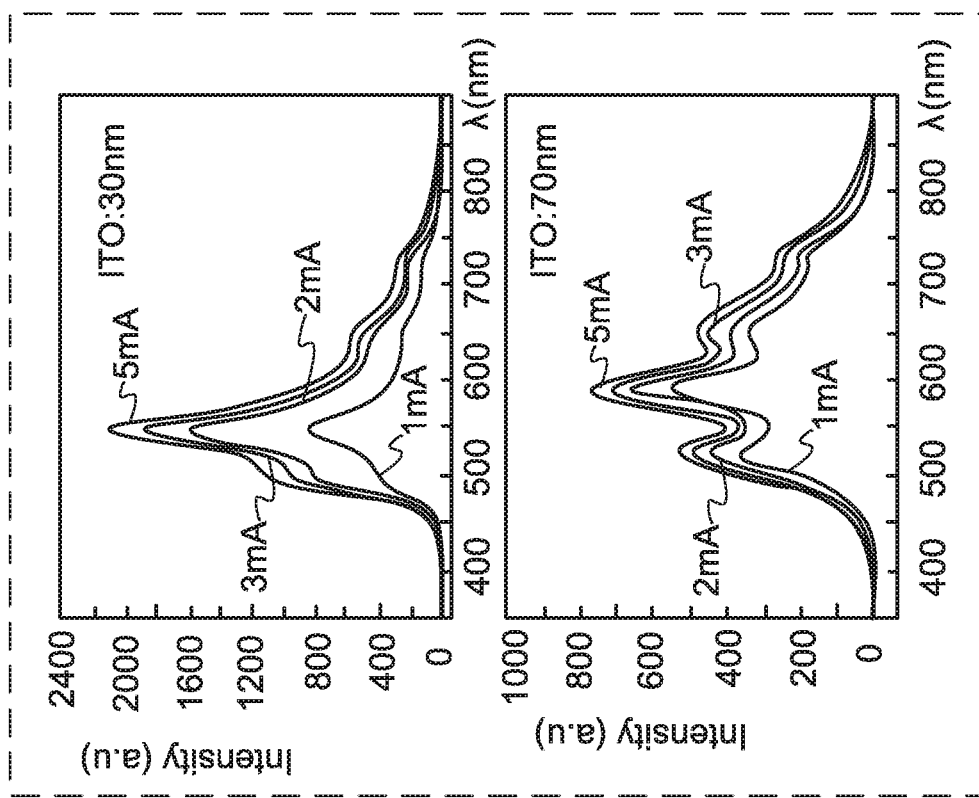
FIGS. 5B and 5C schematically illustrate the spectra of a second exemplary white light-emitting diode and a third exemplary white light-emitting diode with transparent conductive layers of different thicknesses.
Figure 5C:
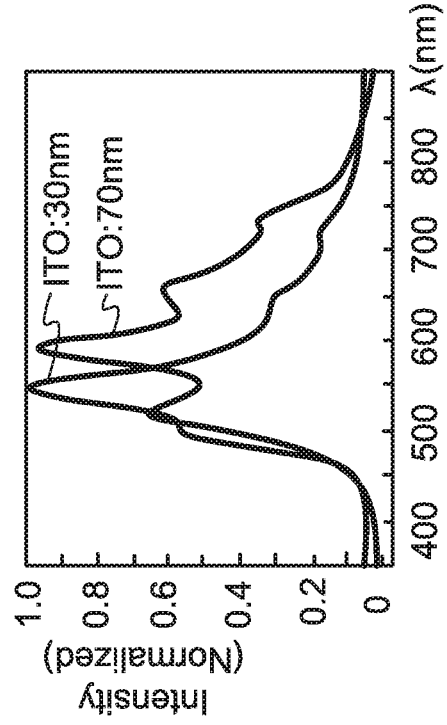

FIGS. 5B and 5C schematically illustrate the spectra of a second exemplary white light-emitting diode and a third exemplary white light-emitting diode with transparent conductive layers of different thicknesses. The thickness of the transparent conductive layer in the second exemplary white light-emitting diode is 30 nm. The thickness of the transparent conductive layer in the third exemplary white light-emitting diode is 70 nm. Moreover, the thickness of the white light emitting layer in the each of the two white light-emitting diodes is smaller than 10 nm. Moreover, the spectrum of each of the two light-emitting diodes demonstrates plural peak wavelengths.

Please refer to FIG. 5B. As the thickness of the ITO layer of the light-emitting diode is decreased, the peak wavelength of the light-emitting diode is decreased and the radiation intensity is increased. Since the thickness of the microcavity is reduced, the light beam emitted by the light-emitting diode has the blue shift with reduced microcavity thickness. Moreover, the radiation intensity corresponding to the blue light (e.g., wavelength=470 nm) is increased by about four times, and the radiation intensity corresponding to the green light (e.g., wavelength=500 nm) is increased by about four times. Whereas, the radiation intensity corresponding to the orange light (e.g., wavelength=590 nm) and the radiation intensity corresponding to the red light (e.g., wavelength=650 nm) are nearly unchanged. This phenomenon indicates that the optical gain of the microcavity is shown on the glass substrate 410.

Please refer to FIG. 5C. As the thickness of the ITO layer of the light-emitting diode is decreased from 70 nm to 30 nm, the maximum peak wavelength of the light-emitting diode is decreased from about 590 nm to about 550 nm.

Figure 6A:
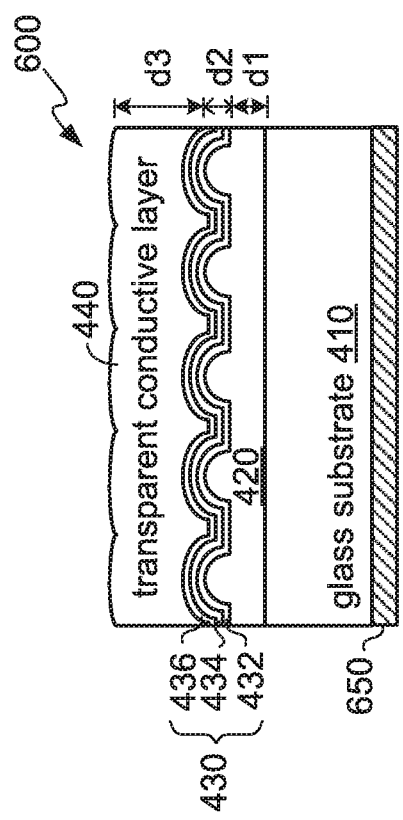
FIG. 6A schematically illustrates the structure of a top-emitting light-emitting diode according to a second embodiment of the present invention.

For increasing the light intensity, the structure of the light-emitting diode may be modified. FIG. 6A schematically illustrates the structure of a top-emitting light-emitting diode according to a second embodiment of the present invention. In comparison with the first embodiment of FIG. 4D, the top-emitting light-emitting diode 600 of this embodiment further comprises a reflective layer 410. The reflective layer 650 is disposed on a bottom surface of the glass substrate 410 in order to increase the light intensity of the top-emitting light-emitting diode 600.

Figure 6B:
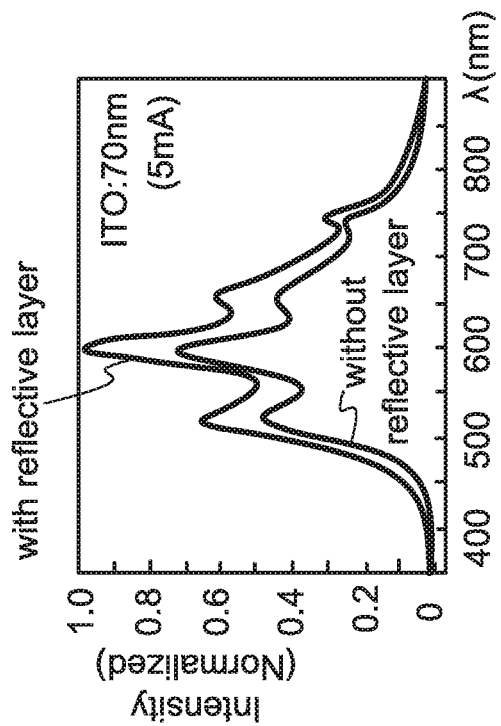
FIG. 6B schematically illustrate the spectra of the light-emitting diodes of the first embodiment and the second embodiment.

FIG. 6B schematically illustrate the spectra of the light-emitting diodes of the first embodiment and the second embodiment. In the two light-emitting diodes, the thickness of the ITO layer is 70 nm. In case that the driving current is 5 mA, the light intensity of the LED 600 with the reflective layer 650 is about 20% higher than the intensity of the LED 400 without the reflective layer.

Moreover, the refractive index of the polysilicon layer 420 is very large (e.g., n=4.0), which is much larger than the refractive index of the indium tin oxide film (e.g., n=1.8). Consequently, fundamental and low order transverse mode is mainly in the polysilicon layer 420. In an embodiment, the polysilicon layer 420 has a smaller thickness (e.g., 50 nm~75 nm), the thickness of the indium tin oxide (ITO) layer is 50 nm, and the white light emitting layer 430 is 10 nm. Consequently, the microcavity is limited to a resonant cavity in the fundamental mode (i.e., m=1). In addition, the LED 400 is a white light source in the RGB fundamental mode.

Moreover, since the sub-wavelength structures 422 are discretely arranged on the polysilicon layer 420 at regular intervals, the light extraction efficiency of the LED 400 is enhanced.

As mentioned above, the LED 400 is a white light source in the RGB fundamental mode. After the transparent conductive layer 440 is subjected to an etching process, plural grating patterns with different spatial frequencies. Consequently, the LED 400 is suitable for the RGB light beams. For example, the first grating pattern, the second grating pattern and the third grating pattern are suitable for the red light, the green light and the blue light, respectively. In other words, the red light, the green light and the blue light are diffracted and outputted from the LED 400 through the first grating pattern, the second grating pattern and the third grating pattern, respectively.

From the above descriptions, the present invention provides a top-emitting LED. As the thickness of the transparent conductive layer is changed, the microcavity is changed and the peak value of the LED is adjusted. In case that the polysilicon layer has a smaller thickness (e.g., 50 nm~75 nm), the LED is a white light source in the RGB fundamental mode. Moreover, the RGB colors are emitted from the top surface of the LED through the grating patterns.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A top-emitting light-emitting diode, comprising:
   a glass substrate;
   a polysilicon layer formed on a first surface of the glass substrate, wherein plural sub-wavelength structures are discretely arranged on a surface of the polysilicon layer at regular intervals;
   a reflective layer formed on a second surface of the glass substrate;
   a white light emitting layer formed over the polysilicon layer and the plural sub-wavelength structures; and
   a transparent conductive layer formed over the white light emitting layer.

2. The top-emitting light-emitting diode as claimed in claim 1, wherein the polysilicon layer, the white light emitting layer and the transparent conductive layer are collaboratively formed as a microcavity.

3. The top-emitting light-emitting diode as claimed in claim 2, wherein a total thickness of the polysilicon layer, the white light emitting layer and the transparent conductive layer is not larger than $2\lambda/n$, wherein $\lambda$ is a wavelength in a range between 500 nm and 600 nm, and n is a refractive index of the microcavity corresponding to the wavelength.

4. The top-emitting light-emitting diode as claimed in claim 3, wherein the total thickness of the polysilicon layer, the white light emitting layer and the transparent conductive layer is equal to $\lambda/n$ or $2\lambda/n$.

5. The top-emitting light-emitting diode as claimed in claim 1, wherein after a laser annealing process is performed to cyclically irradiate a laser beam on the polysilicon layer, the plural sub-wavelength structures are formed on the surface of the polysilicon layer.

6. The top-emitting light-emitting diode as claimed in claim 1, wherein the white light emitting layer is a stack structure comprising a first barrier layer, a quantum well layer and a second barrier layer.

7. A top-emitting light-emitting comprising:
   a glass substrate;
   a polysilicon layer formed on a first surface of the glass substrate, wherein plural sub-wavelength structures are discretely arranged on a surface of the polysilicon layer at regular intervals;
   a white light emitting layer formed over the polysilicon layer and the plural sub-wavelength structures;
   a transparent conductive layer formed over the white light emitting layer; and
   plural grating patterns, formed on a surface of the transparent conductive layer.

8. The top-emitting light-emitting diode as claimed in claim 7, wherein the polysilicon layer is an n-type polysilicon layer or a p-type polysilicon layer.

9. The top-emitting light-emitting diode as claimed in claim 7, wherein the white light emitting layer is a stack structure comprising a first barrier layer, a quantum well layer and a second barrier layer.

10. The top-emitting light-emitting diode as claimed in claim 9, wherein the first barrier layer, the quantum well layer and the second barrier layer are made of aluminium gallium oxynitride, indium gallium oxynitride and aluminium gallium oxynitride, respectively.

11. The top-emitting light-emitting diode as claimed in claim 9, wherein the first barrier layer, the quantum well layer and the second barrier layer are made of hafnium oxynitride, aluminium gallium oxynitride and hafnium oxynitride, respectively.

12. The top-emitting light-emitting diode as claimed in claim 9, wherein the first barrier layer, the quantum well layer and the second barrier layer are made of aluminium gallium oxynitride, zinc oxynitride and aluminium gallium oxynitride, respectively.

* * * * *